(12) United States Patent
Robbins

(10) Patent No.: US 8,710,351 B2
(45) Date of Patent: Apr. 29, 2014

(54) SOLAR POWER SYSTEM WITH COMMUNICATION NETWORK UTILIZING MAGNETIC FIELDS

(76) Inventor: Steven Andrew Robbins, Calabasas, CA (US)

(*) Notice: Subject to any disclaimer, the term of this patent is extended or adjusted under 35 U.S.C. 154(b) by 385 days.

(21) Appl. No.: 13/272,502

(22) Filed: Oct. 13, 2011

(65) Prior Publication Data

US 2012/0325283 A1 Dec. 27, 2012

Related U.S. Application Data

(60) Provisional application No. 61/499,768, filed on Jun. 22, 2011.

(51) Int. Cl.
*H01L 31/042* (2014.01)
*H01L 31/00* (2006.01)
*H01M 10/44* (2006.01)

(52) U.S. Cl.
USPC ............................ 136/244; 136/252; 320/101

(58) Field of Classification Search
USPC ................................... 136/244, 252; 320/101
See application file for complete search history.

(56) References Cited

U.S. PATENT DOCUMENTS

| | | | |
|---|---|---|---|
| 6,608,464 B1 * | 8/2003 | Lew et al. | 320/107 |
| 7,898,212 B2 * | 3/2011 | Benn et al. | 320/101 |
| 8,299,412 B2 * | 10/2012 | Pan | 250/203.4 |
| 8,548,391 B2 * | 10/2013 | Zuckerman et al. | 455/73 |
| 2012/0318320 A1 * | 12/2012 | Robbins | 136/244 |

* cited by examiner

Primary Examiner — M'Baye Diao

(57) ABSTRACT

A solar power system with a communications network for reporting the performance status of each solar module in the array. The network includes short range peer-to-peer wireless links between adjacent solar modules along the rows and columns of the array, resulting in a matrix network topology. The wireless links are implemented with modulated magnetic fields.

20 Claims, 8 Drawing Sheets

SOLAR POWER SYSTEM WITH COMMUNICATION NETWORK UTILIZING MAGNETIC FIELDS

RELATED APPLICATIONS

This application claims priority from U.S. provisional utility application No. 61/499,768 filed on 22 Jun. 2011.

BACKGROUND

The invention relates generally to the field of solar power, and more specifically to communication networks used to monitor and control photovoltaic solar power arrays.

In a conventional photovoltaic (PV) solar power array, the overall system efficiency is often significantly degraded by partial shading of the array, damaged cells, or mismatches in the characteristics of individual cells. To explain how this occurs, FIG. 1 shows a conventional system 1 consisting of four strings 2 wired in parallel. Each string consists of a number of solar modules 3 in series, and a blocking diode 4. The array feeds power to an inverter 5 via a bus with positive 6 and negative 7 rails. Ideally, the characteristics of each solar module 3 are identical to all the others; given equal sunlight, each solar module 3 outputs the same voltage, and each string 2 carries the same current. In theory, this allows all the PV cells in the array to simultaneously operate at their maximum power points. But in reality this is never the case. For example, suppose one of the solar modules 3 in the first string is shaded. This lowers its output voltage, and hence the voltage of the entire string 2. The other three strings are forced to the same voltage because the strings are wired in parallel. The maximum power point tracking system in the inverter 5 is then forced to a point that is suboptimal for all PV cells. So a single shaded or damaged PV cell can prevent every PV cell in the array from operating at its maximum power point.

One solution well known in the art is to monitor the performance of each module 3 in the array so problems can be identified and corrected. The performance of a module 3 is measured by various parametric data, such as the modules output voltage. This requires some form of communication network to convey parametric data from each solar module 3 to a central computer. FIGS. 2A-2C show three well known methods to implement such a communication network. In all three examples, a plurality of Solar Modules 20 ($SM_0$-$SM_N$) are connected to an inverter 21 via a power bus 22, and a computer 23 receives the parametric data. In FIG. 2A the communication network is implemented with dedicated wires 24. In FIG. 2B the network is implemented with radio links 25. And in FIG. 2C the network is implemented via Power Line Communications (PLC) using a current transformer 26 such as a Rogowski coil.

All the examples in FIGS. 2A-2C are similar in that they use a bus topology for the network, where each solar module 20 communicates directly with the computer 23 via a shared medium, or bus, and the modules 20 must transmit data one at a time. For the system to work, each solar module 20 must be assigned a unique network address so the computer 23 can keep track of which module 20 each piece of data comes from.

When the parametric data indicates that a failure has occurred, the computer 23 identifies the failed solar module 20 by its network address. But a network address is often just a random number programmed into each module 20 at the factory, which is not very helpful to the repairman who must replace the failed module; he needs to know the physical location of the module 20 on the rooftop. So someone has to make a map that relates the network address of each module 20 to its physical location. This task is usually done by the people who install the solar array, and the extra labor adds to the installation cost.

Some prior art references have attempted to solve this problem. For example, U.S. Publication No. 2009-0140719 discloses a system where the solar modules automatically assign their own network addresses based on their location within a chain of series-connected network cables. For instance, the computer might tell the repairman that the bad module is "third from the end of the chain". If the repairman can see the network cables, then he can trace the chain back to the failed module, but unfortunately the cables are typically hidden underneath the modules.

Accordingly, there is a continuing need in the field of solar power for a communication network that simplifies the installation process by avoiding the task of creating a map that relates the network address of each solar module to its physical location. The present invention fulfills this need and provides other related advantages.

SUMMARY

A solar power system including a plurality of solar power modules arranged in an array. Each solar power module utilizes a modulated magnetic field to communicate with adjacent solar power modules within the array. The solar power system also includes a computer coupled to one of the solar power modules via a gateway device. Each solar power module acquires parametric data related to the conversion of light into electricity (e.g. measurements of its output voltage) and the parametric data is passed module-to-module along the rows and columns of the solar power array, until reaching the gateway device, and thence to the computer.

Each solar power module includes a plurality of PV cells, a transceiver coupled to at least one magnetic loop for communicating with adjacent solar power modules via modulated magnetic fields, a digital processing unit, and a power supply circuit that receives power from the PV cells and provides power to the transceiver and digital processing unit. The digital processing unit supplies data to the transceiver circuit, and processes data received by the transceiver circuit. The communication circuitry (transceiver, processor, and power supply) may be housed in a junction box that is part of the solar power module, or may be housed in a separate communication module that attaches to the solar power module with connectors.

The magnetic loops may include a trace on a printed circuit board, a conductor in a frame around the periphery of the solar power module, a conductor embedded within the laminate of the solar power module, or the magnetic loop may be implemented utilizing at least some of the PV solar cells.

BRIEF DESCRIPTION OF THE DRAWINGS

The accompanying drawings illustrate the invention. In such drawings:

FIG. 4A shows a high level block diagram of a solar module with the communication hardware built in;

DETAILED DESCRIPTION

Figure 1:
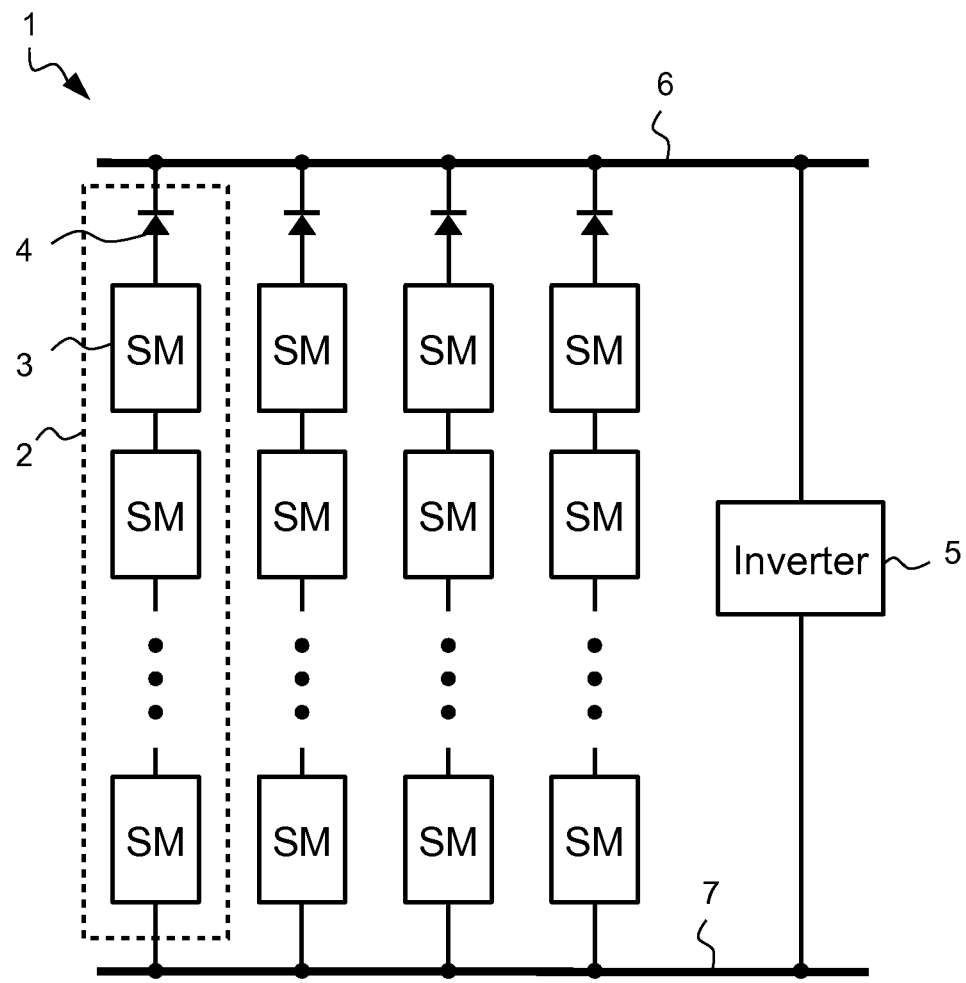
FIG. 1 shows a high level block diagram of a conventional solar power system.
Figure 2A:
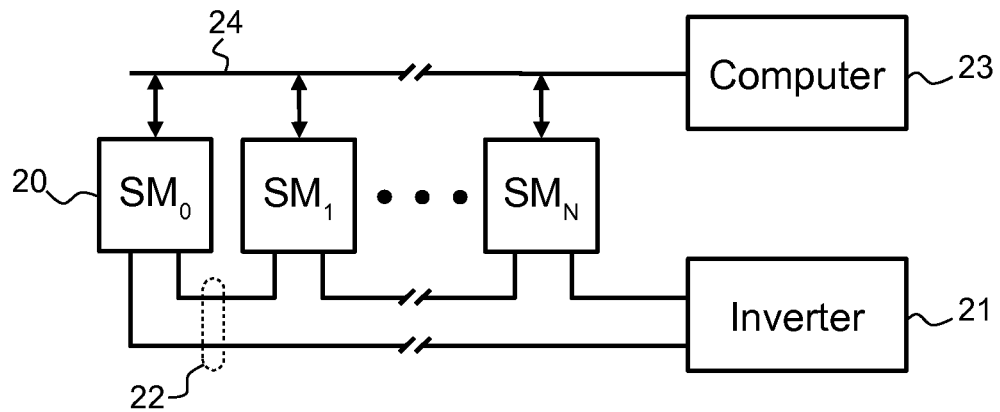
FIG. 2A is an example of prior art showing a solar power system wherein a communication network utilizes dedicated wire connections.
Figure 2B:
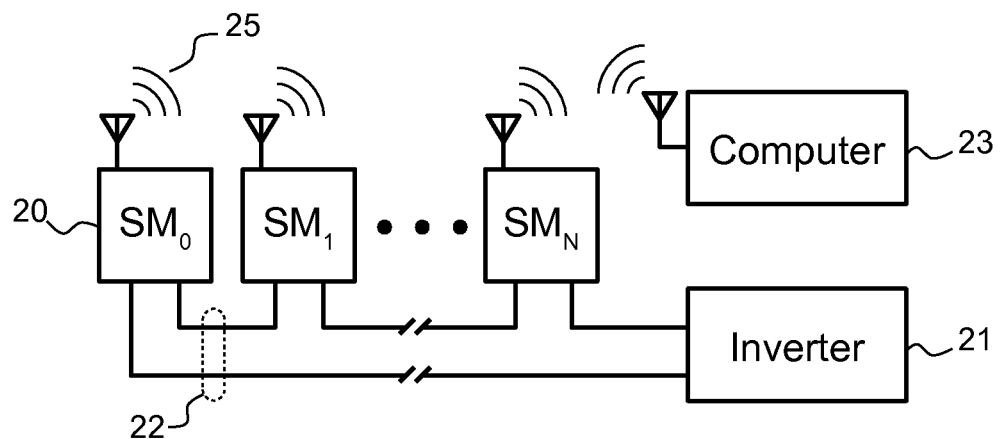
FIG. 2B is another example of prior art showing a solar power system wherein a communication network utilizes radio links.
Figure 2C:
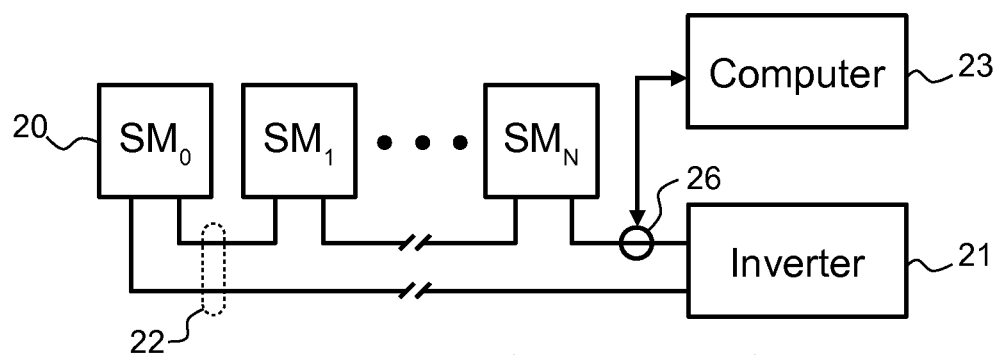
FIG. 2C is yet another example of prior art showing a solar power system wherein a communication network utilizes power lines.
Figure 3A:
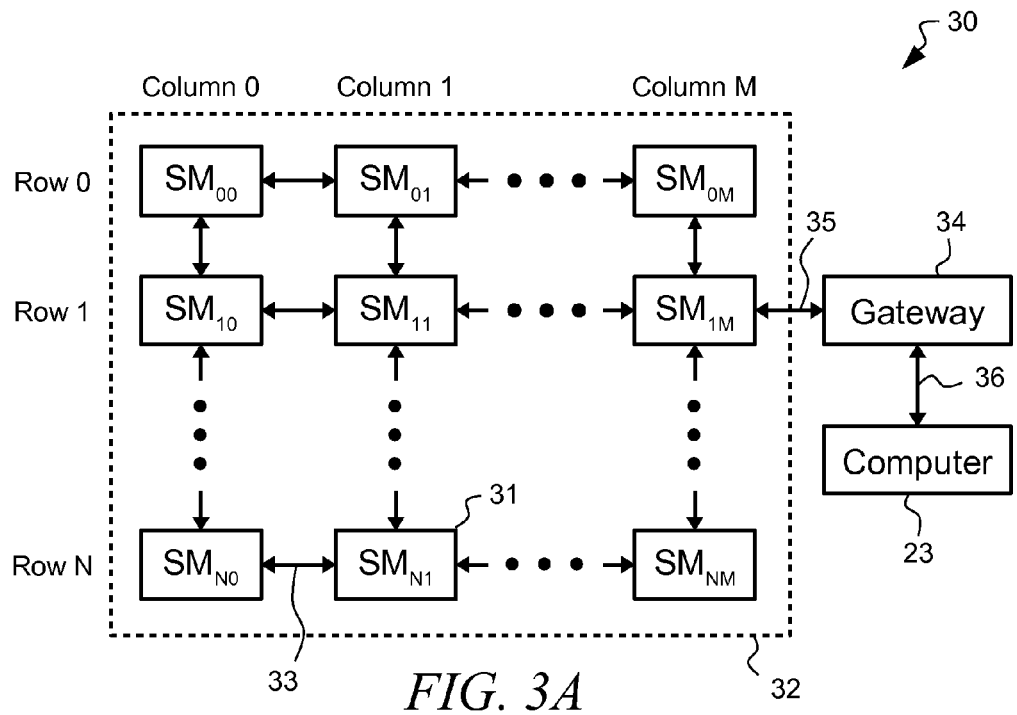
FIG. 3A is a high level diagram illustrating a solar power system as disclosed herein.
Figure 3B:
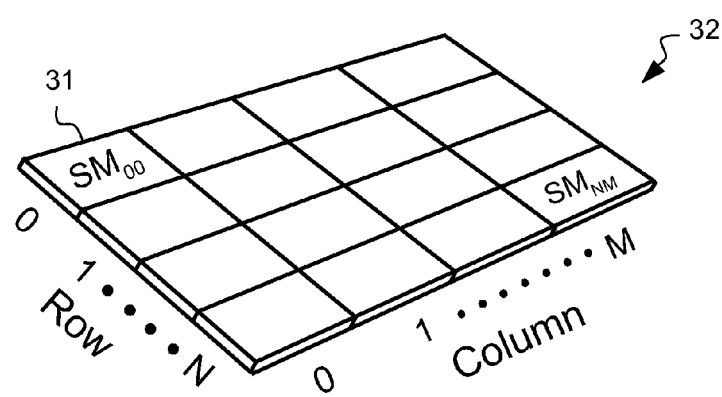
FIG. 3B shows how the communication links relate to the physical locations of the solar modules in the array.

FIG. 3A shows a high level block diagram of the solar power system 30 disclosed herein. The system 30 includes a plurality of solar modules 31 ($SM_{00}$-$SM_{NM}$) arranged in a two dimensional array 32 of N rows by M columns. To keep FIG. 3A simple, the inverter 21 and power cables are not shown. Each solar power module 31 communicates with adjacent solar power modules via short range peer-to-peer communication links 33. Thus, the communication network has a matrix topology, with a structure directly corresponding to the physical layout of the modules 31 in the array 32, as shown in FIG. 3B.

In the context of this document, the term "adjacent" hereinafter refers to the spatial relationship between two solar power modules 31; two modules are considered to be adjacent if they share the same row or column in the solar power array 32, and with no other solar power module 31 between them.

At least one module 31 is connected to a gateway device 34 via a first interface 35. The gateway device 34 is also coupled to a computer 23 via a second interface 36. The main function of the gateway device 34 is to provide electrical isolation between the first interface 35 and second interface 36, because the solar power module 31 will typically be at voltage potential much higher than the computer 23. The second interface 36 may be a cable, a radio link, or a link via Power Line Communications (PLC). The computer 23 may be a part of the inverter 21, or may be a stand-alone computer such as a laptop. The second interface 36 may also comprise a network connection; for example, the gateway device 34 may communicate with the computer 23 via a local area network, or the internet.

Each solar power module 31 in the array 32 converts light into electricity, and acquires parametric data related to the conversion of light into electricity. For example, the parametric data typically includes measurements of the output voltage produced by the solar power module 31. The parametric data may also include measurements of the current flowing through the solar power module 31. The parametric data is passed from module to module along the rows and columns of the array 32 via the communication links 33, and thence to the computer 23 via the gateway device 34. Additionally, each module 31 uses its unique array coordinates as its network address when communicating to the computer 23.

The system 30 differs from the prior art in significant ways. First, the communications medium is different. Magnetic fields are very different from radio waves. For example, magnetic fields do not propagate like radio waves, and magnetic fields are able to penetrate nonferrous conductors that block radio waves. Second, the network topology is fundamentally different. The matrix topology disclosed herein offers the unique advantage of being able to self-organize and automatically assign network addresses to the modules 31 that correlate with their physical location in the array 32.

Figure 4A:
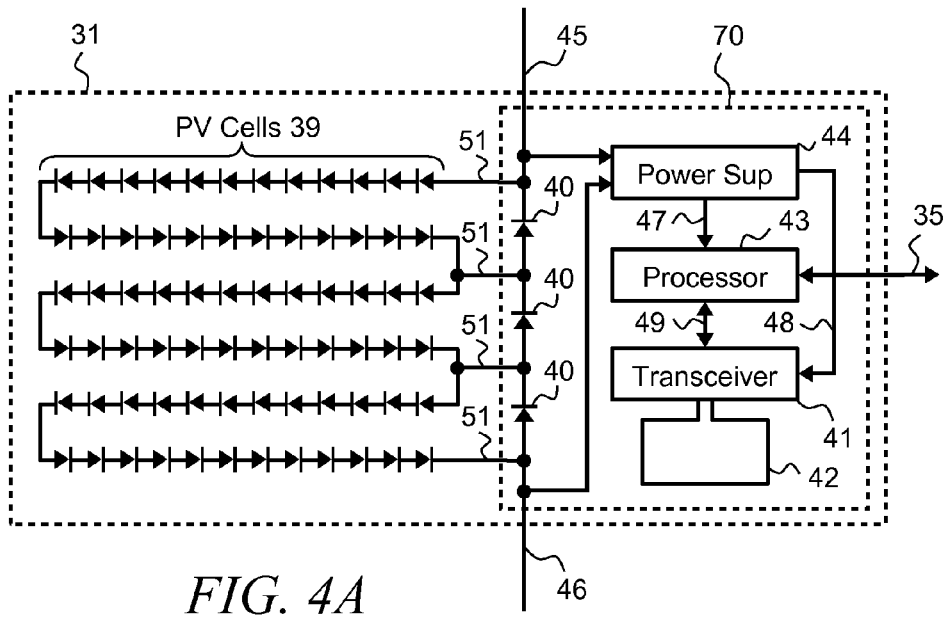

FIG. 4A shows a high level block diagram of a solar module 31 having a plurality of photovoltaic solar cells 39, bypass rectifiers 40, a transceiver 41 coupled to at least one magnetic loop 42, a digital processing unit 43, and a power supply 44. The power supply 44 receives power from PV cells 39 and provides at least one supply voltage 47 to power the processor 43, and at least one supply voltage 48 to power the transceiver 41. The processor 43 has an interface 49 to the transceiver 41 for sending and receiving data. In some embodiments the transceiver 41 operates in a plurality of discrete frequency channels, and the interface 49 also selects the channel. The processor 43 also has an interface 35 for communicating with a gateway device 34.

FIG. 4A shows a preferred embodiment, wherein the communication circuitry 41, 43, and 44 is built into the solar module 31. A junction box 70, typically affixed to the back of the solar module 31, houses the communication circuitry 41, 43, 44 and the bypass rectifiers 40. The junction box 70 has a power interface 51 for receiving power from the PV cells 39. The power interface 51 typically includes connections to the conductive tape commonly used to connect the PV cells 39 in series. The junction box 70 also typically includes a positive cable 45 and a negative cable 46 that connect to other solar modules 31 in the array 32.

Figure 4B:
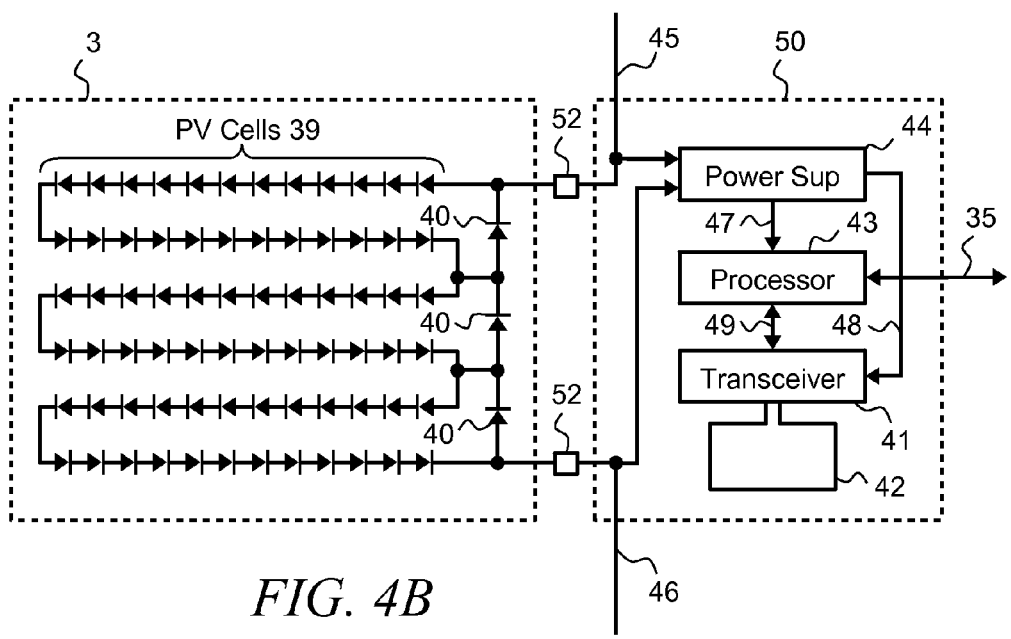
FIG. 4B shows a high level block diagram of the communication hardware in a separate enclosure attached to a conventional solar module.

FIG. 4B shows a high level block diagram of another embodiment, wherein the communication circuitry 41, 43, and 44 is housed in a communications module 50. The communications module 50 has a power interface, typically consisting of connectors 52, for receiving power from a conventional solar module 3. This arrangement allows conventional solar systems, such as the conventional system 1 and the like, to be retrofitted with the network communication hardware, as disclosed herein, by attaching communications modules 50 via the connectors 52.

The short range communication links 33 between solar modules 31 utilize modulated magnetic fields to convey information. Magnetic loops 42 produce and detect the magnetic fields. A magnetic loop 42 is simply a loop of conductor with one or more turns, but it is different from a loop antenna. A loop antenna produces radio waves because its circumference is roughly equal to the carrier wavelength, allowing the formation of standing waves. In contrast, a magnetic loop is far smaller than the carrier wavelength, and its impedance is predominantly inductive, with a small radiation resistance. So, while a magnetic loop can produce electromagnetic waves in the far field (with low efficiency) in the near field, it can produce and detect only magnetic fields. The term "near field" generally refers to the region within about one wavelength radius around the magnetic loop. For example, at 800 kHz, the wavelength is 375 m, which is much larger than the dimensions of most solar power arrays. Thus, magnetic loops offer the benefit of being relatively insensitive to electric and electromagnetic fields generated by near field sources, such as switching mode power supplies.

Figure 5:
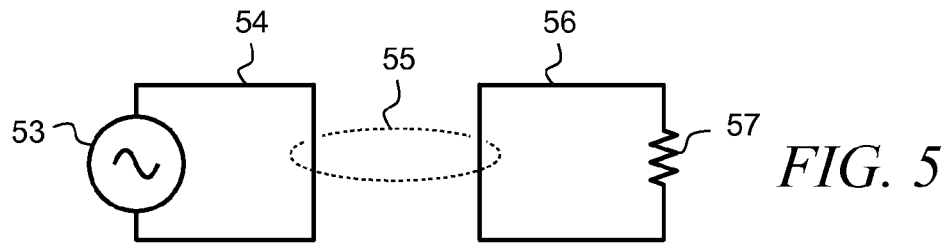
FIG. 5 is an ideal circuit illustrating magnetic loop communications.

To describe the principle of communication via magnetic fields, FIG. 5 shows an equivalent circuit where a signal source 53 produces an ac current flow in a first magnetic loop 54, thus creating an ac magnetic field 55. Some of the magnetic flux lines 55 couple to a second magnetic loop 56, inducing an ac current which the resistor 57 converts to an output voltage. Thus the two circuits are essentially transformer-coupled; the two magnetic loops 54 and 56 form the windings of an air-core transformer with very low coupling coefficient. So magnetic loop communication is wireless, but it is very different from radio, and it has very short range because magnetic fields cannot propagate like radio waves.

Figure 6A:
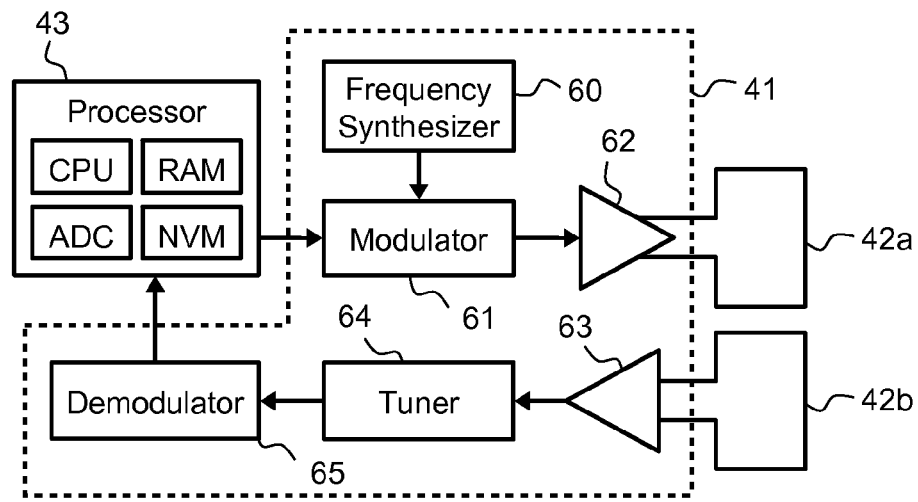
FIG. 6A is a high level block diagram showing an exemplary embodiment of the transceiver utilizing separate magnetic loops for transmit and receive.

The transceivers 41 are similar in architecture to radio transceivers, so a person of ordinary skill in the art will recognize that there may be many different variations. FIG. 6A shows a high level block diagram of a first exemplary embodiment of the transceiver 41 utilizing two separate magnetic loops 42a and 42b. A frequency synthesizer 60 generates a carrier signal, typically in the range of 100 kHz to 800 kHz. The digital processor 43 sends a serial data stream to a modulator 61 which modulates the carrier signal. The modulated carrier signal then goes through a first amplifier 62 which drives a first magnetic loop 42a to transmit the data. Data is received by a second magnetic loop 42b. The received signal goes through a second amplifier 63, a tuner 64, and then a demodulator 65 which sends the recovered digital data stream to the digital processor 43.

The processor 43 comprises the subunits typically found in a microcontroller chip: a Central Processing Unit (CPU), Random Access Memory (RAM), Non-Volatile Memory (NVM), and Analog-to-Digital Converter (ADC). The ADC acquires the parametric data related to the conversion of light into electricity, such as the output voltage of the solar power module 31. Typically, the ADC also quantifies the output of the demodulator 65, as a measure of the received signal strength to facilitate the self-organization process described below.

Figure 6B:
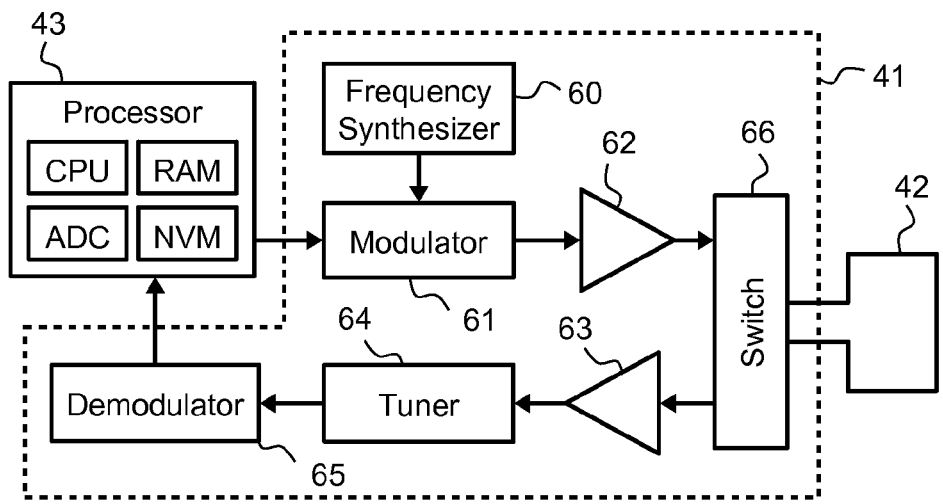
FIG. 6B is a high level block diagram showing an exemplary embodiment of the transceiver utilizing a single magnetic loop for transmit and receive.

FIG. 6B shows another exemplary embodiment of the transceiver 41 where a single magnetic loop 42 is used in conjunction with a transmit/receive switch 66 for half-duplex operation.

Figure 7A:
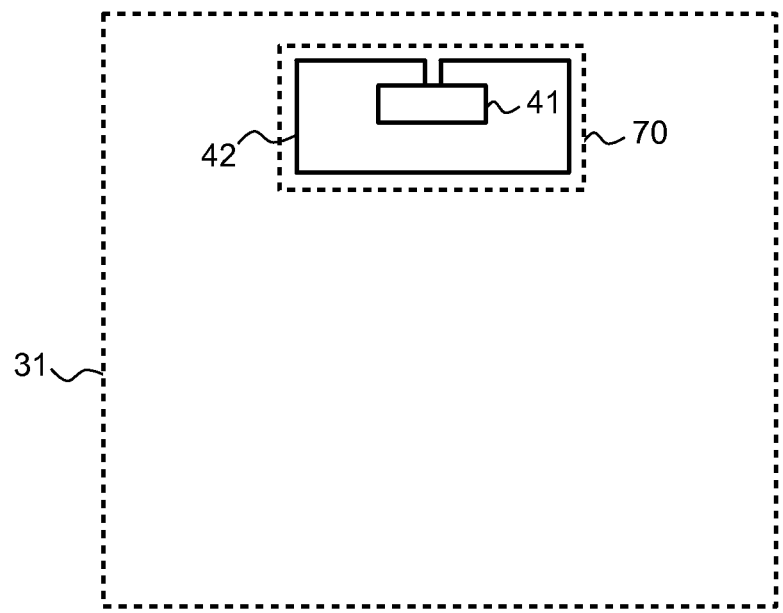
FIG. 7A shows a first embodiment of a magnetic loop that is contained within the junction box.

The magnetic loops have several embodiments. FIG. 7A shows a first embodiment of the magnetic loop 42 that comprises a trace on a printed circuit board. The circuit board is typically housed within the junction box 70 on the back of the solar module 31, and contains the rest of the circuitry: the processor 43, the transceiver 41, and the power supply 44.

Figure 7B:
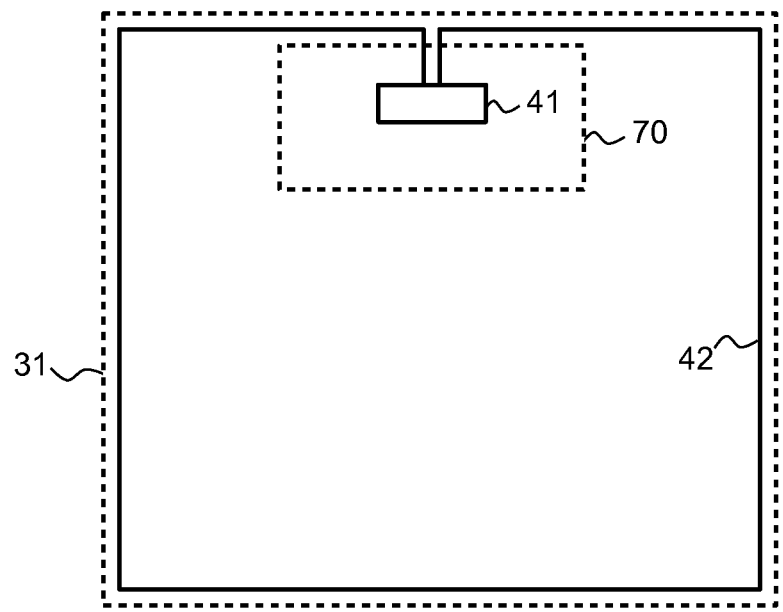
FIG. 7B shows a second embodiment of a magnetic loop that follows the periphery of the solar module.

FIG. 7B shows another embodiment wherein the magnetic loop 42 is external to the junction box 70. Running the loop 42 near the periphery of the module 31 greatly increases the coupling with the magnetic loops in adjacent modules, which simplifies the design of the transceiver 41, for example by reducing the required gain in the receiving amplifier 63, or reducing the required current in the transmitting amplifier 62. Solar power modules are typically constructed by laminating the PV cells between a stiff glass layer that acts as substrate, and a plastic layer that seals out moisture; the magnetic loop 42 in FIG. 7B may be constructed with a piece of wire, or conductive tape embedded within the laminate of the solar module 31. Alternatively, the magnetic loop 42 may be constructed as a wire inside a frame around the edges of the module 31.

Figure 7C:
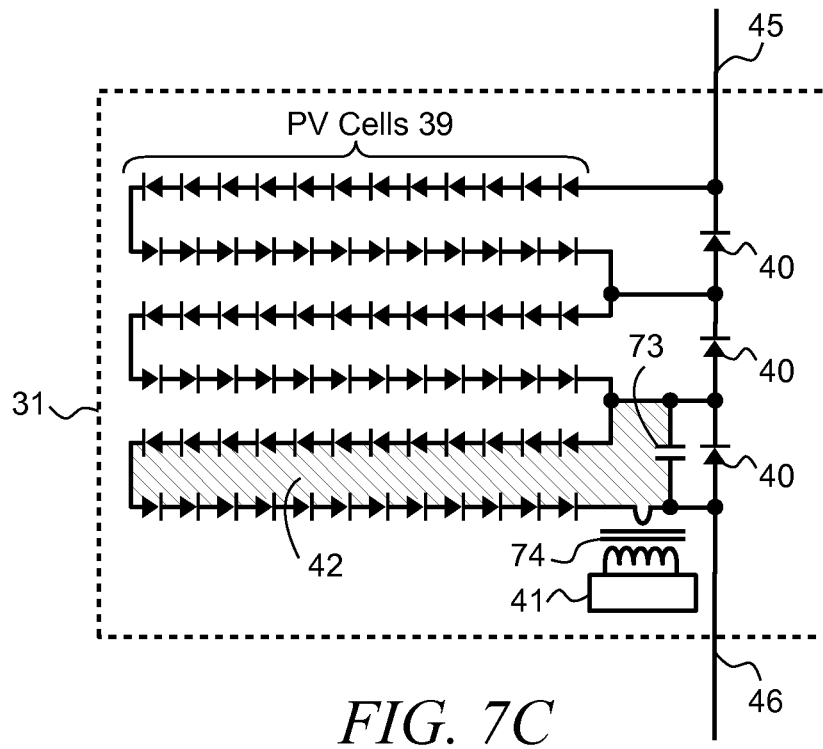
FIG. 7C shows a third embodiment of a magnetic loop that comprises PV cells.

FIG. 7C discloses another embodiment of the magnetic loop. The PV cells 39 in a solar power module 31 are typically arranged in a meandering path, with bypass diodes 40 connected in parallel with segments of PV cells. By adding a capacitor 73 in parallel with one of the bypass diodes 40 a magnetic loop 42 is formed, as indicated by the shaded area. When light shines on the PV cells 39 they conduct electricity like a wire. The capacitor essentially acts as a short circuit at the frequencies utilized by the transceiver 41, closing the segment of PV cells into a conductive loop 42. A transformer 74 couples the transceiver 41 to the magnetic loop 42 to avoid high dc currents in the transceiver 41. The transformer 74 typically has a high turns ratio, for example 100:1, to reduce the current it the transceiver 41.

One advantage of the present invention is the ability of the system to self-organize Self-organization means that each module 31 automatically assigns itself a unique network address, and communication pathways along the rows and columns of the array 32 are automatically formed. These pathways allow parametric data from every module 31 to be conveyed back to the computer 23 via the gateway 34, and also allow commands from the computer 23 to reach all the modules 31.

Figure 8:
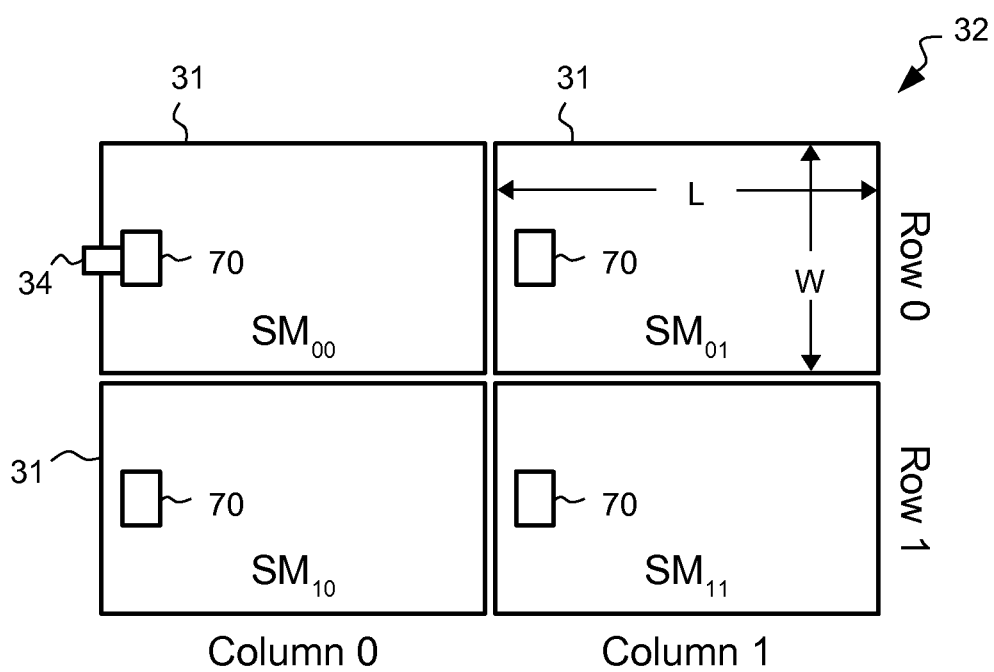
FIG. 8 shows an example illustrating how the system can self-organize.

By way of example, one simplified method of self-organizing, using four steps, is outlined. FIG. 8 shows a 2×2 subsection of an array 32 where each solar module 31 ($SM_{00}$-$SM_{11}$) includes a junction box 70 containing the transceiver 41 and magnetic loop 42, similar to FIG. 4A. The modules 31 have a length (L) to width (W) ratio of 5:3. The gaps between modules 31 are typically very small compared to W and L, so the distances between junction boxes 70 are essentially the module dimensions W and L.

In the first step, each module 31 inhibits transmissions until it has determined its own coordinates within the array 32. Once the coordinates are determined, the module 31 begins broadcasting the coordinates to all nearby modules. So initially, when the array 32 is first installed, all modules 31 are only receiving, not transmitting. The coordinates are represented herein using the format <row,column>.

In the second step, a module 31 connected to a gateway 34 is automatically assigned coordinates <0,0>. In this example, the gateway 34 is always plugged into the module 31 in the upper left corner of the array 32. So according to the first step, module $SM_{00}$ is the first to begin transmitting, and it broadcasts a message containing the coordinates <0,0> to all the nearby modules.

In the third step, when a module receives a signal level above a predetermined threshold, it automatically assigns itself coordinates in the same column as the transmitting module, and a row number that is one greater. $SM_{10}$ receives the strongest signal since it is closest to $SM_{00}$. Signal strength decreases with the square of the distance between junction boxes 70, and given the 5:3 ratio, $SM_{01}$ receives a signal about 4.4 dB weaker than $SM_{10}$. The predetermined threshold is set between these two signal levels. $SM_{10}$ received coordinates <0,0> at a signal strength above the threshold, so it assigns itself coordinates of <1,0>. The other modules $SM_{01}$ and $SM_{11}$ continue to listen because they received signals below the predetermined threshold. So now, both $SM_{00}$ and $SM_{01}$ are broadcasting their coordinates, and the other two modules, $SM_{01}$ and $SM_{11}$, receive both signals.

In the fourth step, when a module receives two adjacent coordinates in the same column, and both signals have strengths below the predetermined threshold, the module automatically assigns itself coordinates based on the stronger of the two signals, by using the same row number and incrementing the column by one. $SM_{01}$ and $SM_{11}$ both receive coordinates <0,0> and <1,0>, which satisfy the conditions for step four because the column numbers are identical and the row numbers differ by only one. $SM_{01}$ sees <0,0> as the stronger signal because it is closer to $SM_{00}$, so $SM_{01}$ assigns itself coordinates <0,1>. Also, $SM_{11}$ sees <1,0> as the stronger signal and assigns itself coordinates <1,1>. Now all four modules broadcast their coordinates, and the process continues until all modules 31 in the array 32 have their coordinates assigned.

Figure 9:
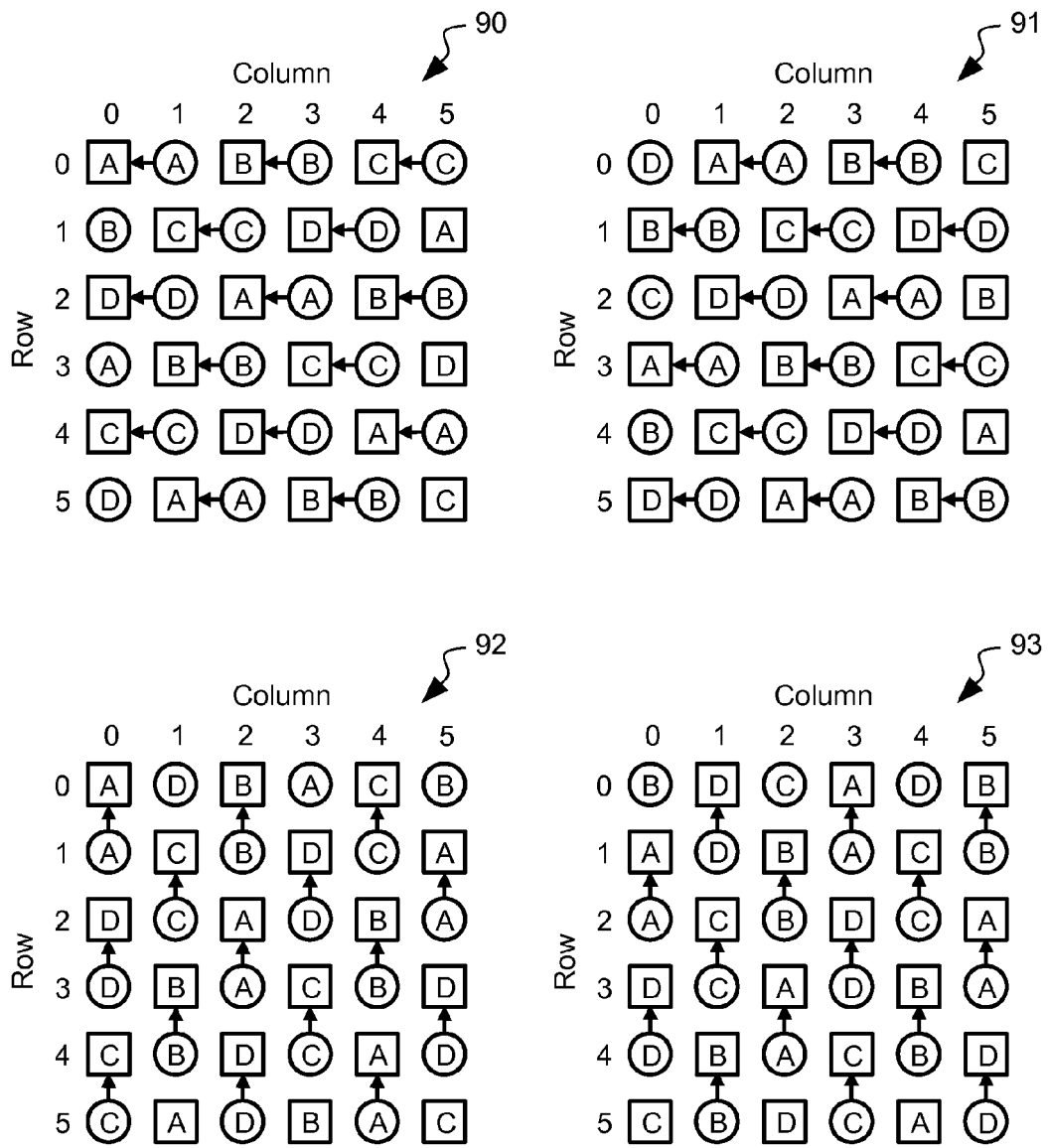
FIG. 9 shows an example illustrating how the system passes data along the rows and columns of the array in an organized manor.

The next step in the self-organization process is to establish data flows from each module 31 to the gateway 34 so that the computer 23 can gather and analyze the parametric data for the entire array 32. Continuing the simplified example from above, where the gateway 34 is connected to $SM_{00}$, FIG. 9 shows a 6×6 matrix where the modules 31 are assigned to four groups A, B, C, and D. The phases 90, 91, 92, and 93 represent four time intervals in a continuously repeating cycle. The circles represent modules 31 that are transmitting, and the squares represent modules 31 that are receiving. In some embodiments the four groups A, B, C, and D are discrete frequency channels; during each phase, each transmitting module is adjacent to four receiving modules, but only one of those receiving modules is tuned to the same frequency as the transmitting module. In other embodiments the four groups A, B, C, and D are different time slices or sub-intervals of each phase; all modules use the same frequency, but at any given instant only one of the modules adjacent to a transmitting module is receiving.

The four phases shown in FIG. 9 allow data to be passed across the array 32 in two directions: up and left. Alternating between phases 90 and 91 passes data along each row from right to left. Similarly, alternating between phases 92 and 93 passes data along each column from bottom to top. This organized behavior allows each module 31 to send its parametric data to the gateway 34 connected to $SM_{00}$ via intermediate modules 31 that act as simple routers. Additionally, it will be obvious to one with ordinary skill in the art that four more phases could be added to the cycle allowing data propagation from left-to-right and top-to-bottom so that commands from the computer 23 can enter the array 32 via the gateway 34 and reach all the modules 31.

Although several embodiments have been described in detail for purposes of illustration, various modifications may be made to each without departing from the scope and spirit of the invention. Accordingly, the invention is not to be limited, except as by the appended claims.

What is claimed is:

1. A solar power system, comprising:
    a plurality of solar power modules arranged into a solar power array, wherein each solar power module comprises:
        a plurality of photovoltaic cells for converting light into electricity,
        a transceiver circuit coupled to at least one magnetic loop for communicating via a modulated magnetic field,
        a digital processing unit for acquiring parametric data related to the conversion of light into electricity and communicating with adjacent solar power modules via the transceiver circuit, and
        a power supply circuit receiving power from at least one of the photovoltaic cells and supplying power to the transceiver circuit and digital processing unit;
    a computer for receiving the parametric data from the solar power modules; and
    a gateway device coupling the computer to one of the solar power modules.

2. The solar power system of claim 1, wherein the parametric data includes a voltage produced by the conversion of light into electricity.

3. The solar system of claim 1, wherein the transceiver circuits communicate on a plurality of frequency channels.

4. The solar power system of claim 1, wherein the gateway device communicates with the computer via a radio link or a signal sent over a power line.

5. A solar power module, comprising:
    at least one segment, each segment consisting of a plurality of photovoltaic cells connected in series for converting light into electricity;
    a transceiver circuit coupled to at least one magnetic loop for communicating via a modulated magnetic field;
    a digital processing unit for acquiring parametric data related to the conversion of light into electricity, supplying data to the transceiver circuit, and processing data received by the transceiver circuit; and
    a power supply circuit receiving power from at least one of the photovoltaic cells and supplying power to the transceiver circuit and digital processing unit.

6. The solar power module of claim 5, wherein the transceiver circuit communicates on a plurality of frequency channels.

7. The solar power module of claim 5, wherein the transceiver circuit comprises a transmitter circuit and a receiver circuit.

8. The solar power module of claim 5, including an interface for communicating with a gateway device.

9. The solar power module of claim 5, wherein at least one magnetic loop comprises a trace on a printed circuit board.

10. The solar power module of claim 5, wherein at least one magnetic loop comprises a wire embedded within a frame around the periphery of the solar power module.

11. The solar power module of claim 5, wherein at least one magnetic loop comprises a conductor embedded within the laminate of the solar power module.

12. The solar power module of claim 5, including one or more capacitors, each capacitor connected in parallel with a segment of photovoltaic cells to form a magnetic loop.

13. The solar power module of claim 5, including a transformer for coupling the transceiver to at least one magnetic loop.

14. A communication apparatus for solar power modules, comprising:
    an interface for receiving power from a plurality of photovoltaic cells;
    a transceiver circuit coupled to at least one magnetic loop for communicating via a modulated magnetic field;
    a digital processing unit for acquiring parametric data related to power produced by the photovoltaic cells, supplying data to the transceiver circuit, and processing data received by the transceiver circuit; and
    a power supply circuit receiving power from at least one of the photovoltaic cells, and supplying power to the transceiver circuit and digital processing unit.

15. The communication apparatus of claim 14, wherein the parametric data includes a voltage produced by the photovoltaic cells.

16. The communication apparatus of claim 14, wherein the transceiver circuit communicates on a plurality of frequency channels.

17. The communication apparatus of claim 14, wherein the transceiver circuit comprises a transmitter circuit and a receiver circuit.

18. The communication apparatus of claim 14, including an interface for communicating with a gateway device.

19. The communication apparatus of claim 14, wherein at least one magnetic loop is external to the communication apparatus.

20. The communication apparatus of claim 14, including at least one bypass diode coupled to the photovoltaic cell interface.

* * * * *